United States Patent
Sakanishi (10) Patent No.: US 11,981,833 B2
(45) Date of Patent: *May 14, 2024

(54) POLISHING COMPOSITION FOR SEMICONDUCTOR WIRING

(71) Applicant: DAICEL CORPORATION, Osaka (JP)

(72) Inventor: Yuichi Sakanishi, Tokyo (JP)

(73) Assignee: DAICEL CORPORATION, Osaka (JP)

( * ) Notice: Subject to any disclaimer, the term of this patent is extended or adjusted under 35 U.S.C. 154(b) by 616 days.

This patent is subject to a terminal disclaimer.

(21) Appl. No.: 17/262,088

(22) PCT Filed: Mar. 18, 2020

(86) PCT No.: PCT/JP2020/011996
§ 371 (c)(1),
(2) Date: Jan. 21, 2021

(87) PCT Pub. No.: WO2020/196162
PCT Pub. Date: Oct. 1, 2020

(65) Prior Publication Data
US 2021/0292602 A1   Sep. 23, 2021

(30) Foreign Application Priority Data
Mar. 22, 2019   (JP) .................. 2019-054531

(51) Int. Cl.
*C09G 1/02* (2006.01)
*H01L 21/304* (2006.01)

(52) U.S. Cl.
CPC .............. *C09G 1/02* (2013.01); *H01L 21/304* (2013.01)

(58) Field of Classification Search
CPC ................................ C09G 1/02; H01L 24/304
See application file for complete search history.

(56) References Cited

U.S. PATENT DOCUMENTS 3,637,774 A    1/1972  Babayan et al.
6,420,269 B2 *  7/2002  Matsuzawa ........... C01F 17/235
                                              438/692
(Continued)

FOREIGN PATENT DOCUMENTS

CN    101010274 A    8/2007
CN    103154168 A    6/2013
(Continued)

OTHER PUBLICATIONS

Sagitani et al., "Solution Properties of Homogeneous Polyglycerol Dodecyl Ether Nonionic Surfactants," JAOCS, vol. 66, No. 1, 1989, pp. 146-152, 7 pages total.

(Continued)

*Primary Examiner* — James A Fiorito
*Assistant Examiner* — Ross J Christie
(74) *Attorney, Agent, or Firm* — Birch, Stewart, Kolasch & Birch, LLP (57) ABSTRACT

Provided is a polishing composition for semiconductor wiring providing an excellent polishing rate and preventing occurrence of dishing.

The polishing composition for semiconductor wiring according to the present invention contains a compound represented by Formula (1) below:

$$R^1O\text{—}(C_3H_6O_2)_n\text{—}H \qquad (1)$$

where $R^1$ represents a hydrogen atom, a hydrocarbon group that has from 1 to 24 carbon atoms and may include a hydroxyl group, or a group represented by $R^2CO$, where the $R^2$ represents a hydrocarbon group having from 1 to 24 carbon atoms; and n represents an average degree of polymerization of glycerol units shown in the parentheses and is from 2 to 60.

20 Claims, 1 Drawing Sheet

(56) References Cited

U.S. PATENT DOCUMENTS

| | | | |
|---|---|---|---|
| 6,740,590 B1 * | 5/2004 | Yano | C09G 1/02 |
| | | | 438/692 |
| 7,459,398 B2 | 12/2008 | Minamihaba et al. | |
| 8,273,921 B2 | 9/2012 | Sakanishi et al. | |
| 9,346,977 B2 * | 5/2016 | Minami | C09K 3/1409 |
| 10,196,542 B2 | 2/2019 | Minami et al. | |
| 10,466,592 B2 | 11/2019 | Sakanishi | |
| 10,844,334 B2 | 11/2020 | Sakanishi | |
| 2006/0000808 A1 | 1/2006 | Seki et al. | |
| 2006/0030503 A1 | 2/2006 | Minamihaba et al. | |
| 2008/0300429 A1 | 12/2008 | Sakanishi et al. | |
| 2011/0251437 A1 | 10/2011 | Sakanishi et al. | |
| 2013/0203254 A1 | 8/2013 | Tamada et al. | |
| 2015/0024596 A1 | 1/2015 | Minami et al. | |
| 2016/0009619 A1 | 1/2016 | Maehara et al. | |
| 2016/0040041 A1 | 2/2016 | Minami et al. | |
| 2018/0195030 A1 | 7/2018 | Sakanishi | |
| 2018/0231890 A1 | 8/2018 | Sakanishi | |
| 2019/0093056 A1 | 3/2019 | Yoshino et al. | |
| 2019/0249122 A1 | 8/2019 | Uchida | |

FOREIGN PATENT DOCUMENTS

| | | |
|---|---|---|
| CN | 108303862 A | 7/2018 |
| CN | 108415226 A | 8/2018 |
| JP | 10-270492 A | 10/1998 |
| JP | 2006-49709 A | 2/2006 |
| JP | 2006-49790 A | 2/2006 |
| JP | 2015-205348 A | 11/2015 |
| JP | 2018-6538 A | 1/2018 |
| JP | 2018-78287 A | 5/2018 |
| WO | WO2013/125445 A1 | 8/2013 |
| WO | WO. 2018/079675 A1 | 5/2018 |

OTHER PUBLICATIONS

International Search Report for International Application No. PCT/JP2020/011996, dated Jun. 16, 2020, with an English translation.

International Search Report for International Application No. PCT/JP2020/012142, dated Jun. 9, 2020, with an English translation.

Kato et al., "Surfactant Properties of Purified Polyglycerol Monolaurates," Journal of Surfactants and Detergents, vol. 6, No. 4, Oct. 2003, pp. 331-337.

Chinese Office Action for corresponding Chinese Application No. 202080005198.6, dated Mar. 29, 2022, with English translation.

Taiwanese Office Action and Search Report for Taiwanese Application No. 109108429, dated Jul. 26, 2023.

U.S. Appl. No. 17/261,931, filed Jan. 21, 2021.

\* cited by examiner

POLISHING COMPOSITION FOR SEMICONDUCTOR WIRING

TECHNICAL FIELD

The present invention relates to a polishing composition for semiconductor wiring. The present application claims priority to JP 2019-054531 filed in Japan on Mar. 22, 2019, the content of which is incorporated herein.

BACKGROUND ART

In semiconductor wiring processes, copper-containing metals (e.g., such as copper and copper alloys) have been used as wiring materials in recent years. When using a copper-containing metal as a wiring material, a method, such as a chemical mechanical polishing (which may be hereinafter referred to as "CMP") method, is typically used to form a copper wiring structure.

Specifically, first, a barrier layer formed of a tantalum-containing compound, such as Ta or TaN, is formed on a surface of an insulator layer of a semiconductor wafer having a trench (wiring groove). Then, a conductor layer made of a copper-containing metal is formed on the barrier layer to completely fill at least inside the trench.

Thereafter, a polishing is carried out. In a first polishing, a portion of the conductor layer is polished. In a subsequent polishing, the conductor layer is polished until a portion of the barrier layer at a location other than that of the trench is exposed. Thereafter, a portion of the barrier layer at a location other than that of the trench is also removed by polishing, and the insulator layer is exposed. As a result, a wiring portion of copper is formed on the semiconductor wafer.

A polishing composition used in an application for forming the semiconductor wiring described above is required to have two conflicting functions. First, the polishing composition can facilitate quick removal of the conductor layer, that is, the polishing composition provides an excellent polishing rate. Second, the polishing composition prevents occurrence of dishing (a dish-shaped depression) on the wiring metal surface.

Such polishing compositions are disclosed, including a polishing composition containing two polyether nonionic surfactants with different hydrophile-lipophile balance (HLB) values and an abrasive particle (e.g., Patent Document 1) and a polishing composition containing a tetrazole compound and an oxidizing agent (e.g., Patent Document 2).

CITATION LIST

Patent Document

Patent Document 1: JP 2006-49709 A
Patent Document 2: JP 2006-49790 A

SUMMARY OF INVENTION

Technical Problem

However, use of the polishing composition disclosed in Patent Document 1 or 2 does not fully satisfy the two conflicting functions described above, leaving a room for improvement. In particular, copper is a soft metal, and thus a central portion of the trench surface is polished deeper during polishing, likely causing dishing.

Thus, an object of the present invention is to provide a polishing composition for semiconductor wiring providing an excellent polishing rate and preventing occurrence of dishing.

Another object of the present invention is to provide a method for polishing, the method including polishing a semiconductor wafer including an insulator layer having a trench on a surface of the insulator layer and a conductor layer formed on the surface of the insulator layer using a polishing composition for semiconductor wiring providing an excellent polishing rate and preventing occurrence of dishing.

Still another object of the present invention is to provide a method for producing a semiconductor device, the method including polishing a semiconductor wafer including an insulator layer having a trench on a surface of the insulator layer and a conductor layer formed on the surface of the insulator layer using a polishing composition for semiconductor wiring providing an excellent polishing rate and preventing occurrence of dishing.

Solution to Problem

As a result of diligent research to solve the above problems, the present inventor found that a polishing composition for semiconductor wiring containing a compound represented by Formula (1) below provides an excellent polishing rate and prevents occurrence of dishing. The present invention was completed based on these findings.

That is, an embodiment of the present invention provides a polishing composition for semiconductor wiring (which may be hereinafter referred to as a "polishing composition according to an embodiment of the present invention") containing a compound represented by Formula (1) below.

$$R^1O\text{—}(C_3H_6O_2)_n\text{—}H \quad (1)$$

where $R^1$ represents a hydrogen atom, a hydrocarbon group that has from 1 to 24 carbon atoms and may include a hydroxyl group, or a group represented by $R^2CO$, where the $R^2$ represents a hydrocarbon group having from 1 to 24 carbon atoms; and n represents an average degree of polymerization of glycerol units shown in the parentheses and is from 2 to 60.

The polishing composition for semiconductor wiring provides a water contact angle on a copper plate surface after polishing the copper plate under polishing conditions below of preferably not greater than 20°.
Polishing Conditions
Using a polishing apparatus, the polishing composition is fed to a polyurethane laminated polishing pad at a feed rate of 200 mL/min, and a polishing plate and a carrier are both rotated at 100 rpm to polish a copper plate for 60 seconds while a polishing pressure of 13.8 kPa is applied to the copper plate.

The polishing composition for semiconductor wiring has a ratio of a polishing rate (nm/min) determined under Test Condition 1 below to a dishing amount (nm) determined under Test Condition 2 below [polishing rate (nm/min)/dishing amount (nm)] of preferably not less than 10.
Test Condition 1
Using a polishing apparatus, the polishing composition is fed to a polyurethane laminated polishing pad at a feed rate of 200 mL/min, and a polishing plate and a carrier are both rotated at 100 rpm to polish a copper plate for 60 seconds while a polishing pressure of 13.8 kPa is applied to the copper plate. After the polishing is completed, the polishing rate (nm/min) is determined from a difference in thickness of the copper plate before and after the polishing.

Test Condition 2

Using a polishing apparatus, the polishing composition is fed to a polyurethane laminated polishing pad at a feed rate of 200 mL/min, and a polishing plate and a carrier are both rotated at 100 rpm to polish a copper pattern wafer including a conductor layer made of copper provided on an insulator layer having a trench on a surface thereof via a barrier layer, until an upper surface of the barrier layer is exposed while a polishing pressure of 13.8 kPa is applied to the copper pattern wafer. After the polishing, the dishing amount (nm) is determined from a level difference between the trench and the upper surface of the barrier layer on a surface of the copper pattern wafer.

The polishing composition for semiconductor wiring preferably further contains an anionic surfactant.

In the polishing composition for semiconductor wiring, a content of the compound represented by Formula (1) is preferably from 0.01 to 20 g/L.

In the polishing composition for semiconductor wiring, a weight average molecular weight of the compound represented by Formula (1) is preferably from 100 to 3000.

In the polishing composition for semiconductor wiring, an HLB value of the compound represented by Formula (1) is preferably not less than 14.

The polishing composition for semiconductor wiring preferably further contains an oxidizing agent, and the content of the oxidizing agent is preferably from 1 to 50 parts by weight per 1 part by weight of the compound represented by Formula (1).

The polishing composition for semiconductor wiring preferably further contains an abrasive grain, and the content of the abrasive grain is preferably from 1 to 50 parts by weight per 1 part by weight of the compound represented by Formula (1).

The polishing composition for semiconductor wiring preferably further contains an oxidizing agent and an abrasive grain, and a ratio of content of the oxidizing agent to the abrasive grain (the oxidizing agent/the abrasive grain; a weight ratio) is preferably from 20/80 to 80/20, and a total content of the oxidizing agent and the abrasive grain is preferably from 5 to 100 parts by weight per 1 part by weight of the compound represented by Formula (1).

An embodiment of the present invention also provides a method for polishing (which may be hereinafter referred to as a "method for polishing according to an embodiment of the present invention"), the method including polishing a semiconductor wafer including an insulator layer having a trench on a surface of the insulator layer and a conductor layer formed on the surface of the insulator layer using the polishing composition for semiconductor wiring.

An embodiment of the present invention also provides a method for producing a semiconductor device (which may be hereinafter referred to as a "method for producing a semiconductor device according to an embodiment of the present invention"), the method including polishing a semiconductor wafer including an insulator layer having a trench on a surface of the insulator layer and a conductor layer formed on the surface of the insulator layer using the polishing composition for semiconductor wiring.

In the present specification, the "semiconductor wiring" refers to those formed by laminating a conductor layer containing a copper-containing metal on a surface of the insulator layer of a semiconductor wafer having a trench (wiring groove) and then filling the trench with the conductor layer by removing the conductor layer outside the trench.

Advantageous Effects of Invention

An embodiment of the present invention provides a polishing composition for semiconductor wiring providing an excellent polishing rate and preventing occurrence of dishing. In addition, the polishing composition for semiconductor wiring has excellent wettability and good compatibility with a copper plate surface, thus maintaining a high polishing rate. Thus, the polishing composition for semiconductor wiring can be suitably used in a semiconductor wiring process.

Furthermore, use of the polishing composition according to an embodiment of the present invention allows the polishing to be carried out with an excellent polishing rate and reduced occurrence of dishing, thus achieving efficient production of a high quality semiconductor wafer or semiconductor device.

DESCRIPTION OF EMBODIMENTS

Hereinafter, specific aspects of the present invention will be described.

1. Polishing Composition for Semiconductor Wiring

A polishing composition according to an embodiment of the present invention is a polishing composition that can be suitably used in a semiconductor wiring process. The polishing composition according to an embodiment of the present invention contains a compound represented by Formula (1) below (which may be hereinafter referred to as a "polyglycerol derivative") as an essential component.

Compound Represented by Formula (1)

$$R^1O-(C_3H_6O_2)_n-H \quad (1)$$

where $R^1$ represents a hydrogen atom, a hydrocarbon group that has from 1 to 24 carbon atoms and may include a hydroxyl group, or a group represented by $R^2CO$, where the $R^2$ represents a hydrocarbon group having from 1 to 24 carbon atoms; and n represents an average degree of polymerization of glycerol units shown in the parentheses and is from 2 to 60.

$C_3H_6O_2$ in the parentheses of Formula (1) may have only a structure represented by Formula (2) below, may have only a structure represented by Formula (3) below, or may have both structures shown in Formulas (2) and (3) below.

$$-CH_2-CHOH-CH_2O- \quad (2)$$

$$-CH(CH_2OH)CH_2O- \quad (3)$$

In the $R^1$, from 5 to 75% per molecule is a hydrogen atom.

Examples of the hydrocarbon group in the $R^1$ and the $R^2$ include an aliphatic hydrocarbon group, an alicyclic hydrocarbon group, an aromatic hydrocarbon group, and a group formed by bonding two or more of these groups.

Examples of the aliphatic hydrocarbon group may include linear or branched alkyl groups having from 1 to 24 (preferably from 5 to 20, more preferably from 10 to 20, and even more preferably from 12 to 18) carbon atoms, such as a methyl group, an ethyl group, a propyl group, a pentyl group, a hexyl group, a heptyl group, a 2-ethylhexyl group, an octyl group, an isooctyl group, a decyl group, an isodecyl group, a dodecyl group, a tetradecyl group, an isododecyl group, a myristyl group, an isomyristyl group, a cetyl group, an isocetyl group, a stearyl group, and an isostearyl group; linear or branched alkenyl groups having from 2 to 24 (preferably from 10 to 20 and more preferably from 8 to 18) carbon atoms, such as a vinyl group, a propenyl group, an allyl group, a hexenyl group, a 2-ethylhexenyl group, and an oleyl group; linear or branched alkapolyenyl groups having from 2 to 24 (preferably from 2 to 18) carbon atoms, such as an alkadienyl group, an alkatrienyl group, an alkatetraenyl group, a linoleyl group, and a linolenyl group; and linear or branched alkynyl groups having from 2 to 24 carbon atoms, such as an ethynyl group and a propynyl group.

The alkyl group is, among others, preferably a linear or branched alkyl group having from 8 to 18 carbon atoms (particularly preferably from 8 to 15 carbon atoms and especially preferably from 10 to 15 carbon atoms), such as a dodecyl group and an isostearyl group. The alkenyl group is, among others, preferably a linear or branched alkenyl group having from 8 to 18 carbon atoms, such as a hexenyl group and an oleyl group.

Examples of the alicyclic hydrocarbon group include 3- to 24-membered (preferably 3- to 15-membered and particularly preferably 5- to 8-membered) cycloalkyl groups, such as a cyclopropyl group, a cyclobutyl group, a cyclopentyl group, and a cyclooctyl group; 3- to 24-membered (preferably 3- to 15-membered and particularly preferably 5- to 8-membered) cycloalkenyl groups, such as a cyclopentenyl group and a cyclohexenyl group; and bridged cyclic hydrocarbon groups, such as a perhydronaphthalen-1-yl group, a norbornyl group, an adamantyl group, a tricyclo[$5.2.1.0^{2,6}$] decane-8-yl group, and a tetracyclo[$4.4.0.1^{2,5}.1^{7,10}$]dodecane-3-yl group.

Examples of the aromatic hydrocarbon group include aryl groups having from 6 to 24 (preferably from 6 to 15) carbon atoms, such as a phenyl group and a naphthyl group.

Examples of the hydrocarbon group in which an aliphatic hydrocarbon group and an alicyclic hydrocarbon group are bonded include cycloalkyl substituted alkyl groups (e.g., such as $C_{3-20}$ cycloalkyl substituted $C_{1-4}$ alkyl groups), such as a cyclopentylmethyl group, a cyclohexylmethyl group, and a 2-cyclohexylethyl group. In addition, examples of the hydrocarbon group in which an aliphatic hydrocarbon group and an aromatic hydrocarbon group are bonded include aralkyl groups (e.g., $C_{7-18}$ aralkyl groups) and alkyl substituted aryl groups (e.g., such as a phenyl group or naphthyl group substituted with approximately 1 to 4 $C_{1-4}$ alkyl groups).

Examples of the group represented by the $R^2CO$ include aliphatic acyl groups, such as an acetyl group, a propionyl group, a butyryl group, an isobutyryl group, a stearoyl group, and an oleoyl group; and aromatic acyl groups, such as a benzoyl group, a toluoyl group, and a naphthoyl group.

$R^1$ is, among others, preferably at least one selected from the group consisting of alkyl groups, acyl groups, and a hydrogen atom. In addition, $R^1$ is particularly preferably at least one selected from the group consisting of linear alkyl groups (among others, a methyl group, an ethyl group, a propyl group, a decyl group, a stearyl group, and in particular a methyl group), aliphatic acyl groups (among others, an acetyl group, a butyl group, a stearoyl group, an oleoyl group, and in particular an acetyl group and an oleoyl group), and a hydrogen atom.

$R^1$ is, among others, preferably a linear or branched alkyl group, particularly preferably a linear or branched alkyl group having from 8 to 18 carbon atoms, and especially preferably a linear or branched alkyl group having from 8 to 15 carbon atoms, from the perspective of being able to improve the polishing rate while preventing occurrence of dishing.

In Formula (1), n represents an average degree of polymerization of glycerol. The value of n can be easily changed, for example, in production of a polyglycerol ether from an alcohol and a glycidol, by adjusting a molar ratio of the alcohol and 2,3-epoxy-1-propanol (trade name "Glycidol", available from Daicel Corporation) to be reacted, as described below in a method for producing the compound represented by Formula (1).

The average degree of polymerization n in Formula (1) is, for example, from 2 to 60, preferably from 2 to 40, more preferably from 4 to 20, and even more preferably from 4 to 10. With n of not less than 2, the polishing composition according to an embodiment of the present invention has further improved water solubility and thus has also excellent cleaning properties. In addition, the polishing composition has good adsorption to a metal surface to be polished and provides even better formation of a hydrophilic film. With n of not greater than 60, the polishing composition exhibits good hydrophilicity and thus has further improved water dispersibility. This prevents unnecessary foaming, further improving workability. In the present specification, a method for calculating the average degree of polymerization of glycerol constituting the polyglycerol is not particularly limited, and examples of the method include a method of calculating from a hydroxyl value; and a method of determining the composition of the polyglycerol by, for example, gas chromatography, liquid chromatography, thin layer chromatography, gas chromatograph mass spectrometry, or liquid chromatograph mass spectrometry, and calculating the average degree of polymerization.

Examples of the metal to be polished include copper, silver, gold, zinc, tin, palladium, nickel, cobalt, chromium, manganese, titanium, aluminum, and alloys of two or more metals selected from these metals. Among others, copper or copper alloys are preferred.

The average degree of polymerization n in Formula (1) is, among others, preferably from 5 to 9, more preferably from 5 to 8, and particularly preferably from 5 to 7, from the perspective of being able to improve the polishing rate while preventing occurrence of dishing.

A weight average molecular weight of the compound represented by Formula (1) is, for example, from 100 to 3000. From the perspective of having good adsorption to a metal surface to be polished and being excellent in forming a hydrophilic film, the weight average molecular weight is, among others, preferably from 200 to 3000, more preferably from 200 to 2000, even more preferably from 300 to 2000, and most preferably from 400 to 1500. Furthermore, in addition to the above perspective, from the perspective of providing excellent workability, the weight average molecular weight is even more preferably from 400 to 1000 and most preferably from 400 to 800. In the present specification, the weight average molecular weight is measured by gel permeation chromatography (GPC).

A hydrophile-lipophile balance (HLB) value of the compound represented by Formula (1) is, for example, not less than 14, preferably from 14 to 20, and more preferably from 14 to 18, from the perspective of providing excellent dispersion stability. The HLB value can be calculated by the Griffin method.

The compound represented by Formula (1) in an embodiment of the present invention is, among others, preferably at least one selected from compounds represented by Formulas (1-1) to (1-7) below and, in particular, preferably at least one selected from compounds represented by Formulas (1-1) to (1-4), (1-6), and (1-7) below.

$$C_{12}H_{25}O-(C_3H_6O_2)_4-H \quad (1\text{-}1)$$

$$C_{12}H_{25}O-(C_3H_6O_2)_{10}-H \quad (1\text{-}2)$$

$$C_{18}H_{37}-O-(C_3H_6O_2)_4-H \quad (1\text{-}3)$$

$$C_{18}H_{37}-O-(C_3H_6O_2)_{10}-H \quad (1\text{-}4)$$

$$CH_2=CH-CH_2-O-(C_3H_6O_2)_6-H \quad (1\text{-}5)$$

$$HO-(C_3H_6O_2)_{10}-H \quad (1\text{-}6)$$

$$HO-(C_3H_6O_2)_{20}-H \quad (1\text{-}7)$$

Examples of methods for producing a compound represented by Formula (1) in an embodiment of the present invention include: [1] a method of addition polymerization of 2,3-epoxy-1-propanol to a compound represented by $R^1OH$ (where $R^1$ is the same as described above) in the presence of an alkali catalyst; [2] a method of reacting a compound represented by $R^1X$ (where X represents a halogen atom; and $R^1$ is the same as described above, for example, an alkyl halide or an acid halide) with a polyglycerol; [3] a method of reacting a reactive derivative of a carboxylic acid, such as an acid anhydride, with a polyglycerol; and [4] a method of reacting a polyol, such as a glycidyl ether compound, represented by Formula (4) below:
[Chem. 1]

(4)

where $R^1$ is the same as described above.

Examples of the alkali catalyst used in the method [1] described above include sodium hydroxide, potassium hydroxide, lithium hydroxide, metallic sodium, and sodium hydride. One of these alkali catalysts can be used alone, or two or more of these catalysts can be used in combination.

Examples of the alkyl halide used in the method [2] described above include alkyl chloride, alkyl bromide, and alkyl iodide.

For the polyglycerol used in the method [2] or [4] described above, commercially available products can be suitably used, including those under trade names, for example, "PGL 03P (polyglycerol trimer)", "PGL 06 (polyglycerol hexamer)", "PGL 10 PSW (polyglycerol decamer)", and "PGL XPW (polyglycerol tetracontamer)" (available from Daicel Corporation).

Examples of the polyol used in the method [4] described above include 2,3-epoxy-1-propanol, ethylene glycol, propylene glycol, 1,3-propanediol (trimethylene glycol), glycerol, xylitol, and sorbitol.

The polishing composition according to an embodiment of the present invention contains at least one compound represented by Formula (1) above. As described above, examples of the compound represented by Formula (1) above include polyglycerols, polyglycerol monoethers, and polyglycerol monoesters. Thus, the polishing composition according to an embodiment of the present invention contains at least one polyglycerol derivative selected from polyglycerols, polyglycerol monoethers, and polyglycerol monoesters.

In addition to a polyglycerol, a polyglycerol monoether, and a polyglycerol monoester, the polishing composition according to an embodiment of the present invention may contain, for example, a polyglycerol diether or a polyglycerol diester corresponding to the compounds described above as the polyglycerol derivative. In the polishing composition according to an embodiment of the present invention, a total content of a polyglycerol, a polyglycerol monoether, and a polyglycerol monoester is preferably not less than 75 wt. % and more preferably not less than 90 wt. % of a total amount of the polyglycerol derivative contained in the polishing composition according to an embodiment of the present invention from the perspective of imparting good hydrophilicity. In addition, a total content of a polyglycerol diether and a polyglycerol diester is preferably not greater than 5 wt. % and, in particular, preferably not greater than 1 wt. % of the total amount of the polyglycerol derivative contained in the polishing composition according to an embodiment of the present invention. The content of each component included in the polyglycerol derivative is determined by separating each component by high performance liquid chromatography, calculating a peak area using a differential refractive index detector, and calculating the area ratio.

The content (g/L) of the compound represented by Formula (1) above in the polishing composition according to an embodiment of the present invention is not particularly limited but is, for example, preferably not less than 0.01 g/L, more preferably not less than 0.05 g/L, even more preferably not less than 0.1 g/L, and most preferably not less than 0.3 g/L. With the content of the compound represented by Formula (1) above within the above range, a hydrophilic film is formed on a metal to be polished, further preventing excessive reduction in the polishing rate. In addition, the content (g/L) of the compound represented by Formula (1) above is, for example, preferably not greater than 20 g/L, more preferably not greater than 10 g/L, even more preferably not greater than 5 g/L, and most preferably not greater than 3 g/L. With the content of the compound represented by Formula (1) above within the above range, occurrence of dishing is further prevented while polishing ability is maintained. The content of the compound represented by Formula (1) above is a total content of all the compound(s) represented by Formula (1) above in the polishing composition according to an embodiment of the present invention.

Additional Component
Anionic Surfactant:

The polishing composition according to an embodiment of the present invention preferably further contains an anionic surfactant from the perspective of maintaining a high polishing rate and further preventing occurrence of dishing. Only one, or two or more anionic surfactants may be used.

The anionic surfactant preferably contains, among others, a compound represented by Formula (5) below and/or Formula (6) below:

$$R^3-Y^1 \quad (5)$$

$$R^3-X^1-Y^1 \quad (6)$$

where, $R^3$ represents an alkyl group, an alkenyl group, or an aryl group; $X^1$ represents a polyoxyalkylene group; and $Y^1$ represents an anionic functional group.

Examples of the alkyl group in $R^3$ include linear or branched alkyl groups having from 1 to 20 (preferably from 5 to 15 and particularly preferably from 8 to 12) carbon atoms, such as a methyl group, an ethyl group, a propyl group, an isopropyl group, a butyl group, an isobutyl group, an s-butyl group, a t-butyl group, a pentyl group, a hexyl group, a decyl group, and a dodecyl group.

Examples of the alkenyl group in $R^3$ include alkenyl groups having approximately from 2 to 20 carbon atoms, such as a vinyl group, an allyl group, a 1-butenyl group, and an oleyl group.

Examples of the aryl group in $R^3$ include aryl groups having from 6 to carbon atoms, such as a phenyl group and a naphthyl group. A substituent may be attached to the aryl group. Examples of the substituent include $C_{1-5}$ alkyl groups and $C_{1-5}$ alkoxy groups. Examples of the aryl group having a substituent include a tolyl group.

The anionic functional group of $Y^1$ is preferably a residue of a carboxylic acid, phosphoric acid, phosphorous acid, sulfuric acid, sulfurous acid, sulfonic acid, or a salt of these acids, and is preferably a sulfuric acid residue, a sulfurous acid residue, a sulfonic acid residue, or a salt of these acids, from the perspective of being able to improve the polishing rate while preventing occurrence of dishing. In addition, the compound represented by Formula (5) above or Formula (6) above may contain a counter ion, such as, for example, an ammonium cation, an amine cation, an alkali metal cation (e.g., such as a lithium cation, a sodium cation, and a potassium cation). From the perspective of improving the polishing rate, the counter ion is, among others, preferably at least one selected from the group consisting of a potassium cation, an ammonium cation, and an amine cation, more preferably an ammonium cation or a triethanolamine cation, and most preferably an ammonium cation.

The polyoxyalkylene group in $X^1$ in Formula (6) above is represented by, for example, $[(OR^4)_t]$. The $R^4$ represents an alkylene group having from 1 to 4 carbon atoms (preferably an alkylene group having from 2 to 4 carbon atoms). In addition, the t is an average number of repetitions of the oxyalkylene group ($OR^4$) and represents a number not less than 1. The t $R^4$ may be identical or different.

Examples of the polyoxyalkylene group specifically include a polyoxyethylene group, a polyoxypropylene group, and a poly(oxyethylene-oxypropylene) group.

The average number of repetitions t is not particularly limited but is, for example, not greater than 6. The upper limit of the average number of repetitions t is preferably 4, more preferably 3, particularly preferably 2.5, and most preferably 2. The lower limit of the average number of repetitions t is, for example, 0.5 and preferably 1. With the average number of repetitions t within the above range, occurrence of metal corrosion (referred to as a "slit") of the wiring edge portion in the conductor layer is further prevented.

For the polishing composition according to an embodiment of the present invention containing an anionic surfactant, the mechanism for forming the hydrophilic film on a metal surface to be polished is inferred as follows. However, the mechanism of an embodiment of the present invention is not limited to the following inference.

The polyglycerol derivative contained in the polishing composition according to an embodiment of the present invention has an effect of adsorbing to a hydrophobic surface of a protective film formed on a metal surface to be polished, the protective film formed by the anionic surfactant, and forming a protective film. A hydrophobic portion of the polyglycerol derivative is attached to the hydrophobic surface of the protective film formed by the anionic surfactant, and a hydrophilic portion of the polyglycerol derivative is positioned on the opposite side from the hydrophobic surface of the protective film formed by the anionic surfactant.

Thus, the surface of the protective film formed by the polyglycerol derivative on the hydrophobic surface of the protective film formed by the anionic surfactant has hydrophilicity. Once the protective film (hydrophilic film) by the polyglycerol is formed on the hydrophobic surface of the protective film formed by the anionic surfactant, an affinity with a surface to be polished improves, and the polishing rate on the surface to be polished by the polishing composition according to an embodiment of the present invention improves. As a result, this prevents excessive reduction in the polishing rate on the metal surface to be polished by the polishing composition according to an embodiment of the present invention also in using the anionic surfactant is used.

When the polishing composition according to an embodiment of the present invention contains an anionic surfactant, the content (g/L) of the anionic surfactant in the polishing composition according to an embodiment of the present invention is not particularly limited but is, for example, preferably not less than 0.01 g/L, more preferably not less than 0.03 g/L, even more preferably not less than 0.05 g/L, still more preferably not less than 0.08 g/L, and most preferably not less than 0.1 g/L. With the content of the anionic surfactant within the above range, a protective film sufficient to prevent excessive polishing is formed on a metal surface to be polished, further preventing dishing. In addition, the content of the anionic surfactant is, for example, preferably not greater than 10 g/L, more preferably not greater than 5 g/L, even more preferably not greater than 1 g/L, still more preferably not greater than 0.5 g/L, and most preferably not greater than 0.3 g/L. With the content of the anionic surfactant within the above range, a protective film formed on a metal surface to be polished has an appropriate thickness, maintaining the polishing rate even better. The content of the anionic surfactant is a total content of all the anionic surfactant(s) in the polishing composition according to an embodiment of the present invention.

The content of the anionic surfactant is, for example, from 0.05 to 1.00 parts by weight, preferably from 0.1 to 0.8 parts by weight, and particularly preferably from 0.2 to 0.5 parts by weight per 1 part by weight of the compound represented by Formula (1).

Protective Film-Forming Agent:

The polishing composition according to an embodiment of the present invention preferably further contains a protective film-forming agent from the perspective of further preventing occurrence of dishing. The protective film-forming agent has an effect of adsorbing to a surface to be polished and forming a protective film. A surface of the protective film formed by this protective film-forming agent has hydrophobicity. Once the protective film is formed, an affinity between the protective film and a metal surface to be polished decreases, and the polishing rate decreases. As a result, this prevents excessive removal of the metal surface to be polished also in polishing at a high rate, further preventing occurrence of dishing. Here, the protective film-forming agent does not include the polyglycerol derivative or the anionic surfactant described above. Only one, or two or more of the protective film-forming agents may be used.

Examples of the protective film-forming agent include benzotriazole or benzotriazole derivatives. Benzotriazole derivatives are those formed by substituting a hydrogen atom attached to the five-membered ring of benzotriazole with another atomic group. The protective film-forming agent in the polishing composition according to an embodiment of the present invention is, among others, preferably benzotriazole from the perspective of more effectively preventing occurrence of dishing.

The protective film formed by benzotriazole has hydrophobicity on its surface as a result in which the five-membered ring portion of benzotriazole is attached to a metal surface to be polished, and the benzene ring portion of benzotriazole is positioned on the opposite side from the metal (copper or copper alloy) surface to be polished. The protective film formed by a benzotriazole derivative has hydrophobicity on its surface as a result in which the five-membered ring portion of the benzotriazole derivative is attached to a surface to be polished, and the benzene ring portion of the benzotriazole derivative is positioned on the opposite side from the surface of the metal to be polished.

When the polishing composition according to an embodiment of the present invention contains a protective film-forming agent, the content (g/L) of the protective film-forming agent in the polishing composition according to an embodiment of the present invention is not particularly limited but is, for example, preferably not less than 0.001 g/L and more preferably not less than 0.01 g/L. With the content of the protective film-forming agent within the above range, a protective film sufficient to strongly prevent excessive polishing of a metal surface to be polished is formed on the metal surface to be polished, further effectively preventing occurrence of dishing. In addition, the content of the protective film-forming agent is, for example, preferably not greater than 1 g/L and more preferably not greater than 0.2 g/L. With the content of the protective film-forming agent within the above range, a protective film formed on a metal surface to be polished has an appropriate thickness, maintaining the polishing rate even better. The content of the protective film-forming agent is a total content of all the protective film-forming agent(s) in the polishing composition according to an embodiment of the present invention.

Oxidizing Agent:

The polishing composition according to an embodiment of the present invention preferably further contains an oxidizing agent from the perspective of further improving the polishing rate. The oxidizing agent has an effect of oxidizing a metal to be polished and has a function of further improving the polishing rate of the polishing composition according to an embodiment of the present invention. Only one, or two or more of the oxidizing agents may be used.

Examples of the oxidizing agent include peroxides, such as hydrogen peroxide and ammonium persulfate. The oxidizing agent is, among others, preferably hydrogen peroxide from the perspective of reducing metal contamination of the metal surface to be polished, the metal contamination derived from the oxidizing agent.

When the polishing composition according to an embodiment of the present invention contains an oxidizing agent, the content (g/L) of the oxidizing agent in the polishing composition according to an embodiment of the present invention is not particularly limited but is, for example, preferably not less than 1 g/L, more preferably not less than 3 g/L, and most preferably not less than 5 g/L. With the content of the oxidizing agent within the above range, the polishing rate for a metal to be polished can be further greatly improved. In addition, the content of the oxidizing agent is, for example, not greater than 30 g/L, more preferably not greater than 20 g/L, and most preferably not greater than 15 g/L. With the content of the oxidizing agent within the above range, occurrence of dishing can be further strongly prevented. The content of the oxidizing agent is a total content of all the oxidizing agent(s) in the polishing composition according to an embodiment of the present invention.

When the polishing composition according to an embodiment of the present invention contains an oxidizing agent, the content of the oxidizing agent is, for example, from 1 to 50 parts by weight, preferably from 2 to 40 parts by weight, particularly preferably from 5 to 30 parts by weight, and most preferably from 10 to 30 parts by weight per 1 part by weight of the compound represented by Formula (1).

Containing the compound represented by Formula (1) and an oxidizing agent within the above ranges allows the compound represented by Formula (1) to cover and protect the surface of a metal to be polished, and this can mitigate a chemical polishing action of the oxidizing agent and can prevent occurrence of dishing (a dish-shaped depression) on the metal surface to be polished.

Etchant:

The polishing composition according to an embodiment of the present invention preferably further contains an etchant from the perspective of further improving the polishing rate. The etchant has an effect of etching a metal to be polished and has a function of further improving the polishing rate of the polishing composition according to an embodiment of the present invention. Only one, or two or more of the etchants may be used.

Examples of the etchant may include α-amino acids, such as glycine, alanine, and valine. The etching agent is, among others, preferably glycine from the perspective of further greatly improving the polishing rate for a metal to be polished.

When the polishing composition according to an embodiment of the present invention contains an etchant, the content (g/L) of the etchant in the polishing composition according to an embodiment of the present invention is not particularly limited but is, for example, preferably not less than 0.5 g/L, more preferably not less than 1 g/L, even more preferably not less than 3 g/L, and most preferably not less than 5 g/L. With the content of the etchant within the above range, the polishing rate for a metal to be polished can be further greatly improved. In addition, the content of the etchant is, for example, preferably not greater than 50 g/L, more preferably not greater than 30 g/L, even more preferably not greater than 20 g/L, and most preferably not greater than 15 g/L. With the content of the etchant within the above range, occurrence of dishing can be further strongly prevented. The content of the etchant is a total content of all the etchant(s) in the polishing composition according to an embodiment of the present invention.

Abrasive Grain:

The polishing composition according to an embodiment of the present invention preferably further contains an abrasive grain from the perspective of further improving the polishing rate. The abrasive grain plays a role of mechanically polishing a metal to be polished and have a function of further improving the polishing rate of the polishing composition according to an embodiment of the present invention. Only one type, or two or more types of the abrasive grains may be used.

Examples of the abrasive grain include a silica (a precipitated silica, a fumed silica, a colloidal silica, and a synthetic silica), ceria, alumina, titania, zirconia, germania, manganese oxide, and diamond. The abrasive grain is, among others, preferably a colloidal silica from the perspective of reducing surface defects of a metal to be polished after the polishing.

In addition, an average primary particle diameter of the abrasive grain is, for example, preferably not less than 3 nm, more preferably not less than 5 nm, and most preferably not less than 8 nm. With the average primary particle diameter of the abrasive grain not less than the above lower limit, the polishing rate can be effectively improved. In addition, an average primary particle diameter of the abrasive grain is, for example, preferably not greater than 200 nm, more preferably not greater than 100 nm, and most preferably not greater than 50 nm. With the average primary particle diameter of the abrasive grain not greater than the above upper limit, sedimentation of the abrasive grain in the polishing composition can be prevented. The average primary particle diameter of the abrasive grain is calculated from a specific surface area of the abrasive grain measured by the Brunauer-Emmett-Teller (BET) method.

When the polishing composition according to an embodiment of the present invention contains an abrasive grain, the content (g/L) of the abrasive grain in the polishing composition according to an embodiment of the present invention is not particularly limited but is, for example, preferably not less than 0.5 g/L, more preferably not less than 1 g/L, and most preferably not less than 5 g/L. With the content of the abrasive grain within the above range, the polishing rate for a metal to be polished can be further greatly improved. In addition, the content of the abrasive grain is, for example, not greater than 100 g/L, more preferably not greater than 50 g/L, and most preferably not greater than 20 g/L. With the content of the abrasive grain within the above range, occurrence of dishing can be further strongly prevented. The content of the abrasive grain is a total content of all the abrasive grain(s) in the polishing composition according to an embodiment of the present invention.

When the polishing composition according to an embodiment of the present invention contains an abrasive grain, the content of the abrasive grain is, for example, from 1 to 50 parts by weight, preferably from 2 to 40 parts by weight, particularly preferably from 5 to 30 parts by weight, and most preferably from 10 to 30 parts by weight per 1 part by weight of the compound represented by Formula (1).

Containing the compound represented by Formula (1) and an abrasive grain within the above ranges allows the compound represented by Formula (1) to cover the surface of the abrasive grain, thus preventing aggregation of the abrasive grain and exhibiting an effect of improving the dispersibility of the abrasive grain. This can prevent the aggregate of the abrasive grain from coming into contact with a surface of a metal to be polished and causing dishing (a dish-shaped depression).

The polishing composition according to an embodiment of the present invention preferably further contains an abrasive grain together with the oxidizing agent described above in that the compound represented by Formula (1) prevents aggregation of the abrasive grain and exhibits an effect of increasing the dispersibility of the abrasive grain, and the oxidizing agent provides an effect of improving the polishing rate, enabling the polishing rate to be improved while preventing occurrence of dishing.

The total content (g/L) of the abrasive grain and the oxidizing agent in the polishing composition according to an embodiment of the present invention is, for example, not less than 1 g/L, preferably not less than 5 g/L, particularly preferably not less than 10 g/L, and most preferably not less than 15 g/L. The upper limit of the total content of the abrasive grain and the oxidizing agent is, for example, 50 g/L, preferably 40 g/L, and most preferably 30 g/L.

The total content of the abrasive grain and the oxidizing agent is, for example, from 5 to 100 parts by weight, preferably from 10 to 80 parts by weight, particularly preferably from 20 to 60 parts by weight, and most preferably from 30 to 50 parts by weight per 1 part by weight of the compound represented by Formula (1).

The content of the abrasive grain is preferably from 0.1 to 10 parts by weight, preferably from 0.5 to 5 parts by weight, particularly preferably from 0.5 to 3 parts by weight, and most preferably from 0.5 to 2 parts by weight per 1 part by weight of the oxidizing agent.

The ratio of content of the oxidizing agent to the abrasive grain (the oxidizing agent/the abrasive grain; a weight ratio) is, for example, from 20/80 to 80/20, preferably from 30/70 to 70/30, and particularly preferably from 40/60 to 60/40.

Additional Component:

The polishing composition according to an embodiment of the present invention may further contain an additional component within a range that does not interfere with the effects of an embodiment of the present invention. Examples of the additional component include water, pH adjusting agents, alcohols, and chelates. In addition, in the polishing composition according to an embodiment of the present invention, water used is typically pure water and, among others, preferably ultrapure water. Ultrapure water refers to water with an impurity content of not greater than 0.01 µg/L. "Pure water" in the present specification also includes ultrapure water.

Water contact angle of polishing composition according to embodiment of present invention:

A water contact angle on a copper plate surface at 25° C. after polishing the copper plate using the polishing composition according to an embodiment of the present invention under polishing conditions below is preferably not greater than 20°, more preferably not greater than 18°, and even more preferably not greater than 16°. The polishing composition according to an embodiment of the present invention has the properties described above and thus is even more effective in having the two conflicting performances of: controlling wettability of a metal surface to be polished to provide an excellent polishing rate, and preventing occurrence of dishing.

Polishing Conditions

Using a polishing apparatus, the polishing composition is fed to a polyurethane laminated polishing pad at a feed rate of 200 mL/min, and a polishing plate and a carrier are both rotated at 100 rpm to polish a copper plate for 60 seconds while a polishing pressure of 13.8 kPa is applied to the copper plate.

A purity of the copper plate is preferably not less than 99.9%, more preferably not less than 99.99%, and even more preferably not less than 99.999%. As such a copper plate, for example, a commercially available blanket wafer can be used.

The contact angle between the copper plate surface after the polishing and water can be measured using a contact angle meter. Examples of the method for measuring the water contact angle include a sessile drop method and a drop method, and the method is not particularly limited. Examples of commercially available contact angle meters include a CA-X contact angle meter (available from Kyowa Interface Science Co., Ltd.).

Ratio of polishing rate (nm/min) of polishing composition according to embodiment of present invention/dishing amount (nm):

The polishing composition according to an embodiment of the present invention has a ratio of a polishing rate (nm/min) determined under Test Condition 1 below to a dishing amount (nm) determined under Test Condition 2 below [polishing rate (nm/min)/dishing amount (nm)] of preferably not less than 10, more preferably not less than 20, and even more preferably not less than 30. With the ratio of the polishing rate to the dishing amount of not less than 10, the polishing composition is even more effective in preventing occurrence of dishing while maintaining a high polishing rate.

Test Condition 1

Using a polishing apparatus, the polishing composition is fed to a polyurethane laminated polishing pad at a feed rate of 200 mL/min, and a polishing plate and a carrier are both rotated at 100 rpm to polish a copper plate for 60 seconds while a polishing pressure of 13.8 kPa is applied to the copper plate. After the polishing is completed, the polishing rate (nm/min) is determined from a difference in thickness of the copper plate before and after the polishing.

Test Condition 2

Using a polishing apparatus, the polishing composition is fed to a polyurethane laminated polishing pad at a feed rate of 200 mL/min, and a polishing plate and a carrier are both rotated at 100 rpm to polish a copper pattern wafer including a conductor layer made of copper, the conductor layer provided on an insulator layer via a barrier layer, the insulator layer having a trench on a surface of the insulator layer, until an upper surface of the barrier layer is exposed while a polishing pressure of 13.8 kPa is applied to the copper pattern wafer. After the polishing, the dishing amount (nm) is determined from a level difference between the trench and the upper surface of the barrier layer on a surface of the copper pattern wafer surface.

The polishing rate measured under Test Condition 1 above is preferably not less than 500 nm/min, more preferably not less than 600 nm/min, and even more preferably not less than 700 nm/min from the perspective of rapidly polishing. The thickness of the initial conductor layer is typically approximately 1000 nm, thus a processing time per semiconductor wafer is within 2 minutes at a polishing rate of not less than 500 nm/min, and this is practical.

The dishing amount measured under Test Condition 2 above is preferably not greater than 50 nm, more preferably not greater than 40 nm, and even more preferably not greater than 30 nm from the perspective of producing a high-quality semiconductor wafer in which dishing is prevented.

pH of Polishing Composition According to Embodiment of Present Invention:

A pH at 25° C. of the polishing composition according to an embodiment of the present invention is not particularly limited, but the composition is preferably from neutral or near neutral to acidic from the perspective of having an even better adsorption effect to a surface of a metal to be polished. Specifically, the pH is preferably not less than 2, more preferably not less than 4, and most preferably not less than 6 from the perspective of having an even better adsorption effect to a metal surface to be polished and forming a good protective film. In addition, the pH is preferably not greater than 10, more preferably not greater than 9, and most preferably not greater than 8.5 from the perspective of further improving storage stability of the polishing composition according to an embodiment of the present invention and stably forming the protective film. Here, the pH at 25° C. refers to a value that can be measured using a commercially available pH meter and a value 1 minute after the electrode is immersed in the polishing composition according to an embodiment of the present invention.

Next, an example of a method for production the polishing composition according to an embodiment of the present invention will be described.

An example of the method for producing the polishing composition according to an embodiment of the present invention is not limited at all, and the polishing composition can be prepared by mixing the compound represented by Formula (1) with an additional component (e.g., such as an anionic surfactant, a protective film-forming agent, an oxidizing agent, an etchant, an abrasive grain, or a pH adjusting agent) and as appropriate with water.

The content of each component of the polishing composition according to an embodiment of the present invention described as described above is a content in use. Thus, the polishing composition according to an embodiment of the present invention may be supplied in a state of a form that can be prepared before use (which may be hereinafter referred to as a "material for preparing the polishing composition according to an embodiment of the present invention").

The material for preparing the polishing composition according to an embodiment of the present invention is a material from which the polishing composition according to an embodiment of the present invention can be prepared by diluting with water. The material for preparing the polishing composition according to an embodiment of the present invention can be in a liquid form of various types, such as a solution, an emulsion, or a suspension, and can be in a form of various types formed by solidifying or semi-solidifying, or encapsulating the liquid form, such as a gel, a capsule, a powder, a particle, or a granule.

For the material for preparing the polishing composition according to an embodiment of the present invention in the form of a solution (concentrated liquid), a dilution ratio is not particularly limited but is preferably not less than 2 times, more preferably not less than 10 times, and even more preferably not less than 50 times from the perspective of reducing distribution cost or storage space.

For the material for preparing the polishing composition according to an embodiment of the present invention in the form of a solution (concentrated liquid), a content of the compound represented by Formula (1) above is, for example, preferably not less than 3 wt. % and more preferably not less than 15 wt. % relative to 100 wt. % of the material for preparing the polishing composition according to an embodiment of the present invention. In addition, a lower limit of the content is preferably not greater than 75 wt. % and more preferably not greater than 50 wt. %. With the content not less than the above lower limit, the material for preparing the polishing composition according to an embodiment of the present invention is even better in reducing distribution cost or storage space. Furthermore, with the content not greater than the above upper limit, the material for preparing the polishing composition according to an embodiment of the present invention is even better in handleability (ease of preparation).

The material for preparing the polishing composition according to an embodiment of the present invention can be manufactured according to a well-known manufacturing method for a preparation, such as a solution, a solid, a semi-solid, a gel, a capsule, a powder, or a granule, with the exception that the method includes adding the compound represented by Formula (1) above to the water described above.

The polishing composition according to an embodiment of the present invention described above can be suitably used in a method for producing a semiconductor device and a method for polishing a semiconductor device described in detail below.

Method for producing semiconductor device according to embodiment of present invention and method for polishing semiconductor wafer:

The polishing composition according to an embodiment of the present invention can be suitably used in a method for polishing (method for polishing according to an embodiment of the present invention), the method including polishing a semiconductor wafer including an insulator layer having a trench on a surface of the insulator layer and a conductor layer formed on the surface of the insulator layer, or in a method for producing a semiconductor device (method for producing a semiconductor device according to an embodiment of the present invention), the method including the above polishing.

A semiconductor wafer, which is an object to be polished in the method for polishing according to an embodiment of the present invention, includes an insulator layer having a trench on a surface of the insulator layer and a conductor layer formed on the surface of the insulator layer. The conductor layer is formed of a copper-containing metal (e.g., such as copper or copper alloy). In addition, a barrier layer to prevent diffusion of the copper-containing metal is present between the conductor layer and the insulator layer. A width of the trench (which indicates a thickness of the wiring) is not particularly limited. Examples of a barrier metal material constituting the barrier layer may include low resistance metal materials, such as, for example, TiN, TiW, Ta, TaN, W, and WN. The barrier metal material is, among others, preferably Ta or TaN from the perspective of providing excellent barrier performance.

In a semiconductor wiring process, a portion of the conductor layer is typically polished in a first polishing. In a subsequent polishing (what is called a final polishing), the conductor layer is polished until a portion of the barrier layer at a location other than in the trench is exposed. Finally, a portion of the barrier layer at a location other than that of the trench is then also removed by polishing, and the insulator layer is exposed. As a result, a wiring portion of the copper-containing metal (i.e., a portion filled with the conductor layer in the trench) is formed on the semiconductor wafer. In particular, the polishing composition according to an embodiment of the present invention provides an excellent polishing rate and prevents occurrence of dishing, and thus can be suitably used in the final polishing application described above.

EXAMPLES

Hereinafter, the present invention will be described more specifically with reference to examples, but the present invention is not limited by these examples.

A compound represented by Formula (1) (a polyglycerol derivative) was produced as follows.

Production Example 1

To 1 mol of lauryl alcohol, 4 mol of 2,3-epoxy-1-propanol (trade name "Glycidol", available from Daicel Corporation) was added, and a polyglycerol derivative (A1) ($C_{12}H_{25}O$—$(C_3H_6O_2)_4$—H, molecular weight: 482) was obtained.

Production Example 2

A polyglycerol derivative (A2) ($C_{12}H_{25}O$—$(C_3H_6O_2)_{10}$—H, molecular weight: 926) was obtained in the same manner as in Production Example 1 with the exception that the amount of 2,3-epoxy-1-propanol used was changed to 10 mol.

Production Example 3

A polyglycerol derivative (A3) ($C_{12}H_{25}O$—$(C_3H_6O_2)_6$—H, molecular weight: 630) was obtained in the same manner as in Production Example 1 with the exception that the amount of 2,3-epoxy-1-propanol used was changed to 6 mol.

Production Example 4

To 1 mol of isostearyl alcohol, 10 mol of 2,3-epoxy-1-propanol (trade name "Glycidol", available from Daicel Corporation) was added, and a polyglycerol derivative (A4) ($C_{18}H_{37}O$—$(C_3H_6O_2)_{10}$—H, molecular weight: 1010) was obtained.

Production Example 5

To 1 mol of glycerol, 9 mol of 2,3-epoxy-1-propanol (trade name "Glycidol", available from Daicel Corporation) was added, and a polyglycerol derivative (A5) (HO—$(C_3H_6O_2)_{10}$—H, molecular weight: 758) was obtained.

In addition, as Comparative Production Examples, compounds having no structure represented by Formula (1) were produced as follows.

Comparative Production Example 1

To 1 mol of ethylene glycol, 48 mol of ethylene oxide was added, then 38 mol of propylene oxide was added, and a polyoxyalkylene derivative (A6) (molecular weight: 4378) was obtained.

Comparative Production Example 2

To 1 mol of ethylene glycol, 32 mol of ethylene oxide was added, then 20 mol of propylene oxide was added, and a polyoxyalkylene derivative (A7) (molecular weight: 2630) was obtained.

Comparative Production Example 3

To 1 mol of lauryl alcohol, 10 mol of ethylene oxide was added, and a polyoxyalkylene derivative (A8) (molecular weight: 626) was obtained.

Comparative Production Example 4

To 1 mol of lauryl alcohol, 20 mol of ethylene oxide was added, and a polyoxyalkylene derivative (A9) (molecular weight: 1066) was obtained.

Polishing compositions of Examples and Comparative Examples were prepared using the compounds obtained in Production Examples and Comparative Production Examples described above by mixing each component listed in Table 1 with water as appropriate.

The polishing compositions obtained in Examples and Comparative Examples were evaluated for the following. pH of each polishing composition is as shown in Table 1.

Polishing Test

Polishing was carried out under the following conditions, and (1) a water contact angle, (2) a polishing rate, and (3) a dishing amount were evaluated.

Polishing apparatus: One side polishing machine for CMP, Mirra (available from Applied Materials, Inc.)

Object to be polished: (1) Water contact angle evaluation: Copper blanket wafer with a diameter of 200 mm (2) Polishing rate evaluation: Copper blanket wafer with a diameter of 200 mm (3) Dishing amount evaluation: Copper pattern wafer (854 mask pattern) (available from SEMATECH)

Polishing pad: Polyurethane laminated pad IC-1000/Suba IV (available from Rohm and Haas Company)
Polishing pressure: 13.8 kPa
Polishing plate rotation speed: 100 rpm
Feed rate of polishing composition: 200 mL/min
Carrier rotation speed: 100 rpm Evaluation Method (1) Water Contact Angle The water contact angle was determined by measuring a water contact angle on the wafer surface after polishing the copper blanket wafer of the object to be polished (1) for 60 seconds using a wafer cleaning treatment evaluation apparatus "CA-X200" (available from Kyowa Interface Science Co., Ltd.). Here, the water contact angle was measured after the surface of each wafer after the polishing was rinsed with pure water.

(2) Polishing Rate

The polishing rate was determined by polishing the copper blanket wafer of the object to be polished (2) for 60 seconds and dividing a difference in thickness of each wafer before and after the polishing by the polishing time. For the measurement of the thickness of each wafer, a sheet resistance measuring apparatus "VR-120" (available from Kokusai Electric System Service Co., Ltd.) was used.

(3) Dishing Amount

Figure 1:
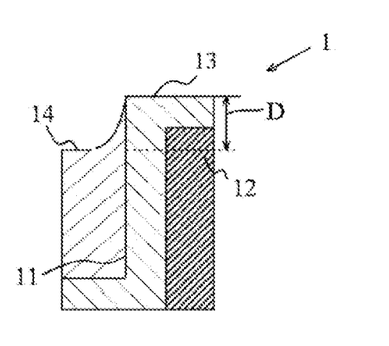
FIG. 1 is a cross-sectional schematic view of a semiconductor wafer for illustrating a dishing amount.

The dishing amount was evaluated by measuring the polished amount of the copper pattern wafer of the object to be polished (3). Specifically, the copper pattern wafer of the object to be polished (3) includes a barrier layer made of tantalum and a conductor layer made of copper and having a thickness of 1000 nm sequentially provided on an insulator layer made of silicon dioxide and having a trench on the surface, and has an initial concave portion with a depth of 500 nm on an upper surface. Before polishing the copper pattern wafer of (3) using each polishing composition of Examples and Comparative Examples, the copper pattern wafer was pre-polished under the above polishing conditions using a commercially available polishing material (trade name "PLANERLITE-7105", available from Fujimi Incorporated) until the thickness of the conductor layer became 300 nm. Then, using each polishing composition of Examples and Comparative Examples, the copper pattern wafer of the object to be polished (3) after the pre-polishing was polished under the above polishing conditions until the upper surface of the barrier layer was exposed. After the polishing, as illustrated in FIG. 1, the dishing (D) amount (nm) was measured from a level difference between the conductor layer 14 in the trench 11 and the upper surface of the barrier layer 13 on a surface of the copper pattern wafer (3) using a contact surface measuring apparatus "Profiler HRP340" (available from KLA-Tencor Corporation). The evaluation results of (1) to (3) are shown in Table 1.

Pot Life

The copper blanket wafer of the object to be polished (2) was polished under the polishing test conditions using each polishing composition of Examples and Comparative Examples immediately after preparation and each polishing composition of Examples and Comparative Examples allowed to stand in a constant-temperature bath at 25° C. for 14 days after preparation. Thereafter, the polishing rate was calculated by dividing a difference in thickness of each wafer before and after the polishing by the polishing time, and a pot life of each polishing compositions was evaluated by comparing the polishing rate of the polishing composition immediately after preparation and the polishing rate of the polishing composition after storing at 25° C. for 14 days, based on the criteria below. From the pot life, it can be evaluated whether the performance of the polishing composition according to an embodiment of the present invention is stably maintained after storage for a predetermined period. The results are shown in Table 1.

Evaluation Criteria:
  Good: A reduction percentage of the polishing rate was not greater than 10%
  Slightly poor: A reduction percentage of the polishing rate was greater than 10%

TABLE 1

| | Component name | | Examples | | | | | | | | |
|---|---|---|---|---|---|---|---|---|---|---|---|
| | | | 1 | 2 | 3 | 4 | 5 | 6 | 7 | 8 | 9 |
| Composition | Compound represented by Formula (1) (Polyglycerol derivative) | Type/ Content (g/L) | (A1)/ 0.5 | (A2)/ 0.5 | (A3)/ 0.5 | (A4)/ 0.5 | (A5)/ 0.5 | (A2)/ 0.5 | (A2)/ 0.5 | (A2)/ 0.5 | (A2)/ 0.5 |
| | Polyoxyalylone derivative | Type/ Content (g/L) | — | — | — | — | — | — | — | — | — |
| | Anionic surfactants | Type/ Content (g/L) | (B1)/ 0.16 | (B1)/ 0.16 | (B1)/ 0.16 | (B1)/ 0.16 | (B1)/ 0.16 | (B2)/ 0.16 | (B3)/ 0.16 | (B4)/ 0.16 | (B5)/ 0.16 |
| | Protective film-forming agent | Type/ Content (g/L) | (C1)/ 0.05 | (C1)/ 0.05 | (C1)/ 0.05 | (C1)/ 0.05 | (C1)/ 0.05 | (C1)/ 0.05 | (C1)/ 0.05 | (C1)/ 0.05 | (C1)/ 0.05 |
| | Oxidizing agent | Type/ Content (g/L) | (D1)/ 10.2 | (D1)/ 10.2 | (D1)/ 10.2 | (D1)/ 10.2 | (D1)/ 10.2 | (D1)/ 10.2 | (D1)/ 10.2 | (D1)/ 10.2 | (D1)/ 10.2 |
| | Etching agent | Type/ Content (g/L) | (E1)/ 10 | (E1)/ 10 | (E1)/ 10 | (E1)/ 10 | (E1)/ 10 | (E1)/ 10 | (E1)/ 10 | (E1)/ 10 | (E1)/ 10 |
| | Abrasive grains | Type/ Content (g/L) | (F1)/ 10 | (F1)/ 10 | (F1)/ 10 | (F1)/ 10 | (F1)/ 10 | (F1)/ 10 | (F1)/ 10 | (F1)/ 10 | (F1)/ 10 |

TABLE 1-continued

| | Component name | | | | | | | | | |
|---|---|---|---|---|---|---|---|---|---|---|
| | | pH adjusting agent | Type/ Content (g/L) | — | — | — | — | — | — | — | — | — |
| Evaluation | | Water | | Remainder | Remainder | Remainder | Remainder | Remainder | Remainder | Remainder | Remainder | Remainder |
| | | pH | | 6.7 | 6.7 | 6.7 | 6.7 | 6.7 | 6.7 | 6.7 | 6.7 | 6.8 |
| | | Water contact angle (*) | | 13 | 17 | 18 | 16 | 16 | 15 | 16 | 15 | 16 |
| | | Polishing rate (nm/min) | | 759 | 801 | 812 | 604 | 759 | 964 | 783 | 871 | 774 |
| | | Disting amount (nm) | | 23 | 20 | 16 | 14 | 21 | 18 | 14 | 17 | 14 |
| | | Ratio of polishing rate (nm/min)/ dishing amount (nm) | | 33.0 | 40.1 | 50.8 | 57.4 | 36.1 | 53.8 | 55.9 | 51.2 | 55.3 |
| | | Pot life | | Good | Good | Good | Good | Good | Good | Good | Good | Good |

| | Component | | Examples | | | | | Comparative Examples | | | |
|---|---|---|---|---|---|---|---|---|---|---|---|
| | name | | 10 | 11 | 12 | 13 | 14 | 1 | 2 | 3 | 4 |
| Composition | Compound represented by Formula (1) (Polyglycerol derivative) | Type/ Content (g/L) | (A2)/ 0.5 | (A2)/ 0.5 | (A2)/ 0.5 | (A2)/ 0.5 | (A2)/ 0.5 | — | — | — | — |
| | Polyoxyalylone derivative | Type/ Content (g/L) | — | — | — | — | — | (A6)/ 0.5 | (A7)/ 0.5 | (A8)/ 0.5 | (A9)/ 0.5 |
| | Anionic surfactants | Type/ Content (g/L) | (B6)/ 0.16 | (B7)/ 0.16 | (B8)/ 0.16 | (B9)/ 0.16 | (B10)/ 0.16 | (B1)/ 0.16 | (B1)/ 0.16 | (B1)/ 0.16 | (B1)/ 0.16 |
| | Protective film-forming agent | Type/ Content (g/L) | (C1)/ 0.05 | (C1)/ 0.05 | (C1)/ 0.05 | (C1)/ 0.05 | (C1)/ 0.05 | (C1)/ 0.05 | (C1)/ 0.05 | (C1)/ 0.05 | (C1)/ 0.05 |
| | Oxidizing agent | Type/ Content (g/L) | (D1)/ 10.2 | (D1)/ 10.2 | (D1)/ 10.2 | (D1)/ 10.2 | (D1)/ 10.2 | (D1)/ 10.2 | (D1)/ 10.2 | (D1)/ 10.2 | (D1)/ 10.2 |
| | Etching agent | Type/ Content (g/L) | (E1)/ 10 | (E1)/ 10 | (E1)/ 10 | (E1)/ 10 | (E1)/ 10 | (E1)/ 10 | (E1)/ 10 | (E1)/ 10 | (E1)/ 10 |
| | Abrasive grains | Type/ Content (g/L) | (F1)/ 10 | (F1)/ 10 | (F1)/ 10 | (F1)/ 10 | (F1)/ 10 | (F1)/ 10 | (F1)/ 10 | (F1)/ 10 | (F1)/ 10 |
| | pH adjusting agent | Type/ Content (g/L) | — | — | — | — | (G1)/ 0.5 | — | — | — | — |
| Evaluation | Water | | Remainder | Remainder | Remainder | Remainder | Remainder | Remainder | Remainder | Remainder | Remainder |
| | pH | | 6.7 | 6.7 | 7.7 | 8.2 | 10 | 6.7 | 6.7 | 6.7 | 6.7 |
| | Water contact angle (*) | | 15 | 16 | 15 | 16 | 15 | 23 | 25 | 21 | 27 |
| | Polishing rate (nm/min) | | 908 | 807 | 703 | 808 | 766 | 581 | 749 | 561 | 693 |
| | Disting amount (nm) | | 21 | 16 | 13 | 14 | 20 | 89 | 112 | 104 | 81 |
| | Ratio of polishing rate (nm/min)/ dishing amount (nm) | | 43.2 | 50.4 | 54.1 | 57.7 | 38.3 | 6.5 | 6.7 | 5.4 | 8.6 |
| | Pot life | | Good | Good | Good | Good | Good | Good | Good | Good | Good |

Note
that "—" in the table indicates "not added".

Evaluation of Results

As shown in Table 1, the polishing compositions of Examples provided an excellent polishing rate and significantly prevented occurrence of dishing, that is, revealing that the polishing compositions have the two conflicting functions. On the other hand, the polishing compositions of Comparative Examples failed to provide a practically satisfactory result for either the polishing rate or the dishing. In particular, in Comparative Examples, the ratio of [polishing rate (nm/min)/dishing amount (nm)] was all less than 10, revealing that the dishing amount was also increased in proportion to the polishing rate.

Details of each component listed in the table are as follows.

Anionic Surfactant (B1): Ammonium polyoxyethylene lauryl ether sulfate having an average number of repetitions of the oxyethylene unit of 2

(B2): Triethanolamine polyoxyethylene lauryl ether sulfate having an average number of repetitions of the oxyethylene unit of 1.5

(B3): Ammonium polyoxyethylene lauryl ether sulfonate having an average number of repetitions of the oxyethylene unit of 2

(B4): Ammonium lauryl sulfonate (B5): Ammonium lauryl benzene sulfonate (B6): Ammonium lauryl sulfate (B7): Polyoxyethylene alkylphenyl ether phosphate having an average number of repetitions of the oxyethylene unit of 4

(B8): Potassium oleate (B9): Potassium polyoxyethylene alkyl ether acetate having an average number of repetitions of the oxyethylene unit of 2

(B10): Ammonium polyoxyethylene alkyl ether acetate having an average number of repetitions of the oxyethylene unit of 2

Protective Film-Forming Agent
    (C1): Benzotriazole
Oxidizing Agent
    (D1): Hydrogen peroxide
Etchant
    (E1): Glycine
Abrasive Grain
    (F1): Colloidal silica, average primary particle diameter of 30 nm pH adjusting agent
    (G1): Potassium hydroxide To summarize the above, the constitution of the present invention and variations of the present invention will be described below.

(1) A composition containing a compound represented by Formula (1) below:

$$R^1O\text{—}(C_3H_6O_2)_n\text{—}H \quad (1)$$

where $R^1$ represents a hydrogen atom, a hydrocarbon group that has from 1 to 24 carbon atoms and may include a hydroxyl group, or a group represented by $R^2CO$, where the $R^2$ represents a hydrocarbon group having from 1 to 24 carbon atoms; and n represents an average degree of polymerization of glycerol units shown in the parentheses and is from 2 to 60.

(2) The composition according to (1), in which a content of the compound represented by Formula (1) is from 0.01 to 20 g/L.

(3) The composition according to (1) or (2), in which a weight average molecular weight of the compound represented by Formula (1) is from 100 to 3000.

(4) The composition according to any one of (1) to (3), in which a hydrophile-lipophile balance value of the compound represented by Formula (1) is not less than 14.

(5) The composition according to any one of (1) to (4), in which the compound represented by Formula (1) is a compound represented by Formula (1') below:

$$R^1O\text{—}(C_3H_6O_2)_n\text{—}H \quad (1')$$

where $R^1$ represents a linear or branched alkyl group that has from 8 to 18 carbon atoms and may include a hydroxyl group; and n represents an average degree of polymerization of glycerin units shown in the parentheses and is from 5 to 8.

(6) The composition according to any one of (1) to (5), further containing an anionic surfactant.

(7) The composition according to (6), in which the anionic surfactant is a compound represented by Formula (6') below:

$$R^3\text{—}X^1\text{—}Y^1 \quad (6')$$

where, $R^3$ represents a linear or branched alkyl group having from 1 to 20 carbon atoms; $X^1$ represents a polyoxyethylene group and/or a polyoxypropylene group; and $Y^1$ represents a residue of sulfuric acid, sulfurous acid, sulfonic acid, or a salt of these acids.

(8) The composition according to any one of (1) to (5), containing from 0.05 to 1.00 parts by weight of a compound represented by Formula (6') below per part by weight of the compound represented by Formula (1):

$$R^3\text{—}X^1\text{—}Y^1 \quad (6')$$

where, $R^3$ represents a linear or branched alkyl group having from 1 to 20 carbon atoms; $X^1$ represents a polyoxyethylene group and/or a polyoxypropylene group; and $Y^1$ represents a residue of sulfuric acid, sulfurous acid, sulfonic acid, or a salt of these acids.

(9) The composition according to any one of (1) to (8), further containing an oxidizing agent, in which a content of the oxidizing agent is from 1 to 50 parts by weight per 1 part by weight of the compound represented by Formula (1).

(10) The composition according to any one of (1) to (8), further containing a peroxide, in which a content of the peroxide is from 1 to 50 parts by weight per 1 part by weight of the compound represented by Formula (1).

(11) The composition according to any one of (1) to (10), further containing an abrasive grain, in which a content of the abrasive grain is from 1 to 50 parts by weight per 1 part by weight of the compound represented by Formula (1).

(12) The composition according to any one of (1) to (10), further containing a silica, in which a content of the silica is from 1 to 50 parts by weight per 1 part by weight of the compound represented by Formula (1).

(13) The composition according to any one of (1) to (10), further containing an oxidizing agent and an abrasive grain, in which a ratio of content of the oxidizing agent to the abrasive grain (the oxidizing agent/the abrasive grain; a weight ratio) is from 20/80 to 80/20, and a total content of the oxidizing agent and the abrasive grain is from 5 to 100 parts by weight per 1 part by weight of the compound represented by Formula (1).

(14) The composition according to any one of (1) to (10), further containing a peroxide and/or a silica, in which a total content of the oxidizing agent and the abrasive grain is from 5 to 100 parts by weight per 1 part by weight of the compound represented by Formula (1).

(15) The composition according to any one of (1) to (10), further containing a peroxide and a silica, in which a ratio of content of the peroxide to the silica (the peroxide/the silica; a weight ratio) is from 20/80 to 80/20, and a total content of the oxidizing agent and the abrasive grain is from 5 to 100 parts by weight per 1 part by weight of the compound represented by Formula (1).

(16) The composition according to any one of (1) to (15), in which a water contact angle on a copper plate surface at 25° C. after polishing the copper plate under polishing conditions below is not greater than 20°,
    where the polishing conditions are as follows:
        using a polishing apparatus, the polishing composition is fed to a polyurethane laminated polishing pad at a feed rate of 200 mL/min, and a polishing plate and a carrier are both rotated at 100 rpm to polish a copper plate for 60 seconds while a polishing pressure of 13.8 kPa is applied to the copper plate.

(17) The composition according to any one of (1) to (16), in which a ratio of a polishing rate (nm/min) determined under Test Condition 1 below to a dishing amount (nm) determined under Test Condition 2 below [polishing rate (nm/min)/dishing amount (nm)] is not less than 10, where the Test Condition 1 is as follows:
    using a polishing apparatus, the polishing composition is fed to a polyurethane laminated polishing pad at a feed rate of 200 mL/min, and a polishing plate and a carrier are both rotated at 100 rpm to polish a copper plate for 60 seconds while a polishing pressure of 13.8 kPa is applied to the copper plate; and after the polishing is completed, the polishing rate (nm/min) is determined from a difference in thickness of the copper plate before and after the polishing; and
the Test Condition 2 is as follows:
    using a polishing apparatus, the polishing composition is fed to a polyurethane laminated polishing pad at a feed rate of 200 mL/min, and a polishing plate and a carrier are both rotated at 100 rpm to polish a copper pattern wafer including a conductor layer made of copper provided on an insulator layer having a trench on a surface thereof via a barrier layer, until an upper surface of the barrier layer is exposed while a polishing pressure of 13.8 kPa is applied to the copper pattern wafer; and after the polishing, the dishing amount (nm) is determined from a level difference between the trench and the upper surface of the barrier layer on a surface of the copper pattern wafer.

(18) The composition according to any one of (1) to (17), in which the composition is a polishing composition for semiconductor wiring.

(19) Use of the composition described in any one of (1) to (18) as a polishing composition for semiconductor wiring.

(20) A method for producing a polishing composition for semiconductor wiring using the composition described in any one of (1) to (18).

(21) A method for polishing, the method including polishing a semiconductor wafer including an insulator layer having a trench on a surface of the insulator layer and a conductor layer formed on the surface of the insulator layer using the composition described in any one of (1) to (18).

(22) A method for producing a semiconductor device, the method including polishing a semiconductor wafer including an insulator layer having a trench on a surface of the insulator layer and a conductor layer formed on the surface of the insulator layer using the composition described in any one of (1) to (18).

REFERENCE SIGNS LIST

1 Semiconductor wafer
11 Trench
12 Insulator layer
13 Barrier layer
14 Conductor layer
D Dishing amount

The invention claimed is:

1. A polishing composition for semiconductor wiring comprising a compound represented by Formula (1) below:

$$R^1O-(C_3H_6O_2)_n-H \quad (1)$$

where $R^1$ represents an alkynyl group having from 5 to 20 carbon atoms, or a group represented by $R^2CO$, where the $R^2$ represents an alkynyl group having from 5 to 20 carbon atoms; and n represents an average degree of polymerization of glycerol units shown in the parentheses and is from 2 to 60.

2. The polishing composition for semiconductor wiring according to claim 1, wherein a water contact angle on a copper plate surface at 25° C. after polishing the copper plate under polishing conditions below is not greater than 20°,
where the polishing conditions are as follows:
using a polishing apparatus, the polishing composition is fed to a polyurethane laminated polishing pad at a feed rate of 200 mL/min, and a polishing plate and a carrier are both rotated at 100 rpm to polish a copper plate for 60 seconds while a polishing pressure of 13.8 kPa is applied to the copper plate.

3. The polishing composition for semiconductor wiring according to claim 1, wherein a ratio of a polishing rate (nm/min) determined under Test Condition 1 below to a dishing amount (nm) determined under Test Condition 2 below, polishing rate (nm/min)/dishing amount (nm), is not less than 10, where
the Test Condition 1 is as follows:
using a polishing apparatus, the polishing composition is fed to a polyurethane laminated polishing pad at a feed rate of 200 mL/min, and a polishing plate and a carrier are both rotated at 100 rpm to polish a copper plate for 60 seconds while a polishing pressure of 13.8 kPa is applied to the copper plate; and after the polishing is completed, the polishing rate (nm/min) is determined from a difference in thickness of the copper plate before and after the polishing; and
the Test Condition 2 is as follows:
using a polishing apparatus, the polishing composition is fed to a polyurethane laminated polishing pad at a feed rate of 200 mL/min, and a polishing plate and a carrier are both rotated at 100 rpm to polish a copper pattern wafer comprising a conductor layer made of copper provided on an insulator layer having a trench on a surface thereof via a barrier layer, until an upper surface of the barrier layer is exposed while a polishing pressure of 13.8 kPa is applied to the copper pattern wafer; and after the polishing, the dishing amount (nm) is determined from a level difference between the trench and the upper surface of the barrier layer on a surface of the copper pattern wafer.

4. The polishing composition for semiconductor wiring according to claim 1, further comprising an anionic surfactant.

5. The polishing composition for semiconductor wiring according to claim 1, wherein a content of the compound represented by Formula (1) is from 0.01 to 20 g/L.

6. The polishing composition for semiconductor wiring according to claim 1, wherein a weight average molecular weight of the compound represented by Formula (1) is from 100 to 3000.

7. The polishing composition for semiconductor wiring according to claim 1, wherein a hydrophile-lipophile balance value of the compound represented by Formula (1) is not less than 14.

8. The polishing composition for semiconductor wiring according to claim 1, further containing an oxidizing agent, wherein a content of the oxidizing agent is from 1 to 50 parts by weight per 1 part by weight of the compound represented by Formula (1).

9. The polishing composition for semiconductor wiring according to claim 1, further containing an abrasive grain, wherein a content of the abrasive grain is from 1 to 50 parts by weight per 1 part by weight of the compound represented by Formula (1).

10. The polishing composition for semiconductor wiring according to claim 1, further containing an oxidizing agent and an abrasive grain, wherein a ratio of content of the oxidizing agent to the abrasive grain, the oxidizing agent/the abrasive grain; a weight ratio, is from 20/80 to 80/20, and a total content of the oxidizing agent and the abrasive grain is from 5 to 100 parts by weight per 1 part by weight of the compound represented by Formula (1).

11. A method for polishing, the method comprising polishing a semiconductor wafer comprising an insulator layer comprising a trench on a surface of the insulator layer and a conductor layer formed on the surface of the insulator layer using the polishing composition for semiconductor wiring described in claim 1.

12. A method for producing a semiconductor device, the method comprising polishing a semiconductor wafer comprising an insulator layer comprising a trench on a surface of the insulator layer and a conductor layer formed on the surface of the insulator layer using the polishing composition for semiconductor wiring described in claim 1.

13. The polishing composition for semiconductor wiring according to claim 1, wherein the compound represented by Formula (1) is a compound represented by Formula (1') below:

$$R^1O-(C_3H_6O_2)_n-H \qquad (1')$$

where $R^1$ represents an alkynyl group that has from 8 to 18 carbon atoms, and n represents an average degree of polymerization of glycerin units shown in the parentheses and is from 5 to 8.

14. The polishing composition for semiconductor wiring according to claim 1, further comprising an anionic surfactant represented by Formula (6') below:

$$R^3-X^1-Y^1 \qquad (6')$$

where, $R^3$ represents a linear or branched alkyl group having from 1 to 20 carbon atoms; $X^1$ represents a polyoxyethylene group and/or a polyoxypropylene group; and $Y^1$ represents a residue of sulfuric acid, sulfurous acid, sulfonic acid, or a salt of these acids.

15. The polishing composition for semiconductor wiring according to claim 1, further comprising an anionic surfactant represented by Formula (6') below:

$$R^3-X^1-Y^1 \qquad (6')$$

where, $R^3$ represents a linear or branched alkyl group having from 1 to 20 carbon atoms; $X^1$ represents a polyoxyethylene group and/or a polyoxypropylene group; and $Y^1$ represents a residue of sulfuric acid, sulfurous acid, sulfonic acid, or a salt of these acids, and a content of the anionic surfactant represented by Formula (6') is from 0.05 to 1.00 parts by weight per 1 part by weight of the compound represented by Formula (1).

16. The polishing composition for semiconductor wiring according to claim 1, further containing a peroxide, wherein a content of the peroxide is from 1 to 50 parts by weight per 1 part by weight of the compound represented by Formula (1).

17. The polishing composition for semiconductor wiring according to claim 1, further containing a silica, wherein a content of the silica is from 1 to 50 parts by weight per 1 part by weight of the compound represented by Formula (1).

18. The polishing composition for semiconductor wiring according to claim 1, further containing a peroxide and a silica, wherein a ratio of content of the peroxide to the silica, the peroxide/the silica; a weight ratio, is from 20/80 to 80/20, and a total content of the oxidizing agent and the abrasive grain is from 5 to 100 parts by weight per 1 part by weight of the compound represented by Formula (1).

19. The polishing composition for semiconductor wiring according to claim 1, further containing benzotriazole or benzotriazole derivatives,
wherein a content of benzotriazole or benzotriazole derivatives is from 0.01 to 0.2 g/L.

20. A polishing composition for semiconductor wiring comprising a compound represented by Formula (1) below:

$$R^1O-(C_3H_6O_2)_n-H \qquad (1)$$

where $R^1$ represents an alkynyl group having from 5 to 20 carbon atoms, and n represents an average degree of polymerization of glycerol units shown in the parentheses and is from 2 to 60.

* * * * *